US005724006A

United States Patent [19]
Kilian et al.

[11] Patent Number: 5,724,006
[45] Date of Patent: Mar. 3, 1998

[54] CIRCUIT ARRANGEMENT WITH CONTROLLABLE TRANSMISSION CHARACTERISTICS

[75] Inventors: Ernst-August Kilian; Christoph Möller, both of Hamburg, Germany

[73] Assignee: U.S. Philips Corporation, New York, N.Y.

[21] Appl. No.: 523,698

[22] Filed: Sep. 5, 1995

[30] Foreign Application Priority Data

Sep. 3, 1994 [DE] Germany ............... 44 31 481.7

[51] Int. Cl.⁶ .................... H03F 1/34; H03F 3/181
[52] U.S. Cl. ............... 330/294; 330/305; 330/306; 330/107
[58] Field of Search ................ 330/107, 109, 330/294, 304, 305, 306; 333/28 T; 381/98, 101, 102, 103; 455/267

[56] References Cited

U.S. PATENT DOCUMENTS

| | | | |
|---|---|---|---|
| 3,860,876 | 1/1975 | Woods | 330/107 X |
| 5,515,446 | 5/1996 | Velmer | 381/98 |

FOREIGN PATENT DOCUMENTS

| | | | |
|---|---|---|---|
| 0091160 | 11/1985 | European Pat. Off. | H03G 3/00 |
| 0456321 | 11/1991 | European Pat. Off. | H03G 5/04 |
| 2231647 | 1/1974 | Germany | H03G 9/00 |
| 3132402 | 5/1982 | Germany | H03G 5/00 |
| 4114364 | 11/1992 | Germany | H03G 9/00 |

OTHER PUBLICATIONS

"Radio Fernsehen Elektronik", vol. 28, No. 12, 1979, Integrierte Lautstarke pp. 751 to 757. no month.

*Primary Examiner*—James B. Mullins
*Attorney, Agent, or Firm*—Edward W. Goodman

[57] ABSTRACT

A circuit arrangement which has a controllable transmission characteristic between a signal input (2) and a signal output (5) for a signal within a given transmission frequency band, the circuit arrangement having a bass control stage (1) to which the signal from the signal input (2) can be applied for adjustably boosting the amplitude-frequency response of the signal at low frequencies of the transmission frequency band. A higher flexibility and an improved transmission characteristic of such a circuit arrangement are obtained with a simplified construction by a notch filter stage (3), to which the signal processed in the bass control stage (1) can be applied for attenuating the amplitude-frequency response of the signal at mid-frequencies of the transmission frequency band independently of the bass control stage (1) and by which the signal thus processed can be applied to the signal output.

11 Claims, 5 Drawing Sheets

5,724,006

1

CIRCUIT ARRANGEMENT WITH CONTROLLABLE TRANSMISSION CHARACTERISTICS

BACKGROUND OF THE INVENTION

1. Field of the Invention

The invention relates to a circuit arrangement, with controllable transmission characteristics between a signal input and a signal output, for a signal within a given transmission frequency band, comprising a bass control stage to which the signal from the signal input can be applied for adjustably boosting the amplitude-frequency response of the signal at low frequencies of the transmission frequency band.

2. Description of the Related Art

DE-PS 31 32 402 corresponding to U.S. Pat. Nos. 4,439, 739,and 4,451,795,describes a circuit arrangement with an electronically controllable transmission characteristic, in which the input signal is applied to an amplifier with controllable negative feedback, the amplifier output being connected to a voltage-divider arrangement. This voltage-divider arrangement has a plurality of taps, which are connected to an inverting input of the amplifier via a first electronically controllable switch and to the output of the circuit arrangement via a second electronically controllable switch. The voltage-divider arrangement can have a frequency-dependent transmission factor, thus enabling the circuit arrangement to be used for treble control or for bass control. By means of such a circuit arrangement, it is possible to construct a tone control circuit for the transmission of an audio signal.

EP-PS 91 160 corresponding to U.S. Pat. No. 4,509,021, describes a signal amplification and/or attenuation circuit having an input for receiving an input signal and an output for supplying an output signal. This circuit further comprises an amplifier stage with an inverting input, a non-inverting input and an output coupled to the circuit output, and a first voltage divider arranged between the circuit input and a first terminal of the circuit and having at least two taps connected to a first controllable switching unit for individually connecting these taps to the non-inverting input, and a controllable negative feedback path from the circuit output to the inverting input with a second voltage divider arranged between the circuit output and a second terminal and having at least two taps connected to a second switching unit for individually connecting these taps to the inverting input of the amplifier. The first and the second terminals are connected to a point of constant potential, each optionally via an impedance, and the first switching unit is controlled in dependence upon the control of the second switching unit. By means of such an arrangement, it is possible to provide a frequency-dependent transmission factor between the input and the output and, consequently, also to provide bass control or treble control.

EP-OS 456 321 corresponding to U.S. Pat. No. 5,206,603, describes a circuit arrangement with an electronically controllable transmission characteristic, in which the input signal is applied to an amplifier with controllable negative feedback, whose output is connected to a voltage-divider arrangement having a frequency-dependent characteristic and having a plurality of taps connected to an inverting input of the amplifier via a first electronically controllable switch, and to an output of the arrangement via a second electronically controllable switch. In order to influence the quality of the various filter curves which can be generated, the two switches are controlled in such a manner that for boosting the input signal in a frequency range determined by the frequency-dependent voltage divider, the first switch is set to such a position that boosting is effected in the desired frequency bandwidth and the position of the second switch is selected so as to obtain the desired degree of boosting, and that for attenuating the input signal in the frequency band determined by the frequency-dependent voltage divider, the second switch is set to such a position that attenuation is obtained in the desired frequency bandwidth, and that the first switch is set to such a position that the desired degree of attenuation is obtained. By means of such an arrangement, the amplitude of a signal can be boosted or attenuated in a given frequency range in a manner similar to a variable band-pass or band-stop filter curve.

The correct adjustment of the amplitude-frequency response of the audio signal is essential for a high-quality faithful reproduction of audio signals by electro-acoustic equipment. As a result of the frequency and volume dependent aural sensitivity, this requires boosting of the bass tones and, to a small extent, the treble tones relative to the mid-range, the degree of boosting being higher as the reproduction volume decreases. To this end, it is known to make the volume control in radio receivers and hi-fi equipment frequency-dependent in such a manner that the bass tones and, to a small extent, also the treble tones are boosted to a higher degree as the loudness decreases. Thus, an automatic adaptation to the amplitude-frequency response of the curves of similar aural sensitivity for the instantaneous volume setting is pursued.

Such measures result in a boost of the low frequencies in the case of quiet reproduction and an attenuation in the case of loud reproduction of sound and are only responsive to volume settings, the volume settings always being related to a similar signal level before the volume controls in such a manner that a given setting always corresponds to the same volume. If the volume control also serves to compensate for different levels of the signal sources, such as radio, audio tape, audio discs or the like, the frequency response thus adapted will exhibit corresponding errors.

DE-PS 22 31 647 describes an audio-frequency amplifier arrangement comprising a main channel and one or more branch channels, which each include a filter transmitting a frequency band of audio frequencies and which either join the main channel in a linear adding network before the output amplifier or which are each connected to a separate loudspeaker via separate output amplifiers. The level in the branch channels can then be boosted to a variable extent for the audio frequency bands which are affected by the aural sensitivity. This known circuit arrangement includes a separate dynamic compression circuit in at least one of the branch channels, which circuit is constructed in such a way that the level of the frequency band for a low volume is boosted in accordance with the curves of equal aural sensitivity and, as the volume increases, the boost increases only to a small extent in relation to the volume.

This amplifier arrangement known from DE-PS 22 31 647 uses a circuit employing a division into a plurality of amplifier channels corresponding to the individual frequency bands, similar to those types of bass, mid-range and treble loudspeakers for which the cross-over networks are not arranged before the loudspeaker systems but for which a separate output amplifier is provided for each frequency band with a separate loudspeaker, the filter transmitting the relevant band preceding the input of this output amplifier.

Such a circuit arrangement requires a complex circuitry.

DE-PS 41 14 364 corresponding to U.S. Pat. No. 5,245, 668 discloses an arrangement for aurally compensated volume control, which serves to provide digital control of an analog audio signal by attenuating this signal. This arrangement comprises a resistive divider device with a correction impedance. The resistive divider device comprises at least two fine-control resistor chains and one coarse-control resistor chain. A tap selector is provided for the resistor chain. This arrangement is also very intricate and only enables a very limited kind of volume control to be obtained.

The article "Integrierte Lautärke- und Klangeinsteller A273 und A274", published in the magazine "Radio Fernsehen Elektronik", volume 28, no. 12, 1979, pp. 751 to 757, describes a circuit arrangement for aurally compensated volume control. The arrangement comprises an electronic potentiometer followed by an amplifier. These circuit elements are again controlled by a control circuit. Aurally compensated volume control is achieved by arranging a T network in the negative-feedback branch of the amplifier with the electronic potentiometer. The control voltage for this potentiometer is combined with the volume control voltage, so that the aurally compensated volume correction has a different effect depending on the magnitude of the volume control voltage. By means of a resistor, this voltage can, in addition, be influenced so as to change the relationship between the aurally-compensated volume correction and the volume control voltage. However, at best it is thus possible to vary a proportionality factor between the volume control voltage and the control voltage for the electronic potentiometer for the aurally compensated volume correction. By means of the electronic potentiometer, a given amplitude-frequency response characteristic for the overall frequency band to be transmitted can be made to change into an amplitude-frequency response variation with frequency-independent amplitude.

It is to be noted that the integrated circuits A273 and A274 described in the above article are identical to integrated circuits types TCA 730 and TCA 740, respectively, described in the "Valvo Brief" of 14.11.1978, "Valvo Technische Informationen für die Industrie"800610 of 10.06.1980 or in the "Valvo Handbuch Integrierte Schaltungen für Fernseh-, Rundfunk- und NF-Anwendungen 1976", pp. 249 to 262.

It has been found that the known circuits for aurally compensated volume control have several drawbacks, which all in all render them unfavorable for use in modern audio signal processing circuits. The circuit arrangements described above are too complex and/or provide only a limited aurally compensated volume control, which does not meet all the requirements. In particular, none of the known circuit arrangements enables an ideal aurally compensated volume control over the entire frequency range and over the entire volume control range for arbitrary signal sources with correspondingly different signals having different amplitude-frequency response characteristics to be obtained by means of a small number of circuit elements.

SUMMARY OF THE INVENTION

It is an object of the invention to provide a circuit arrangement which enables a selectively adjustable amplitude-frequency response to be obtained with a small number of circuit elements, particularly for aurally compensated volume control of audio signals from different sources.

According to the invention this object is achieved with a circuit arrangement of the type defined in the opening paragraph characterized in that circuit arrangement further comprises; of a notch filter stage to which the signal processed in the bass control stage can be applied for attenuating the amplitude-frequency response of the signal at mid-frequencies of the transmission frequency band independently of the bass control stage and by which the signal thus processed can be applied to the signal output.

By means of the inventive combination of the bass control stage with the notch filter stage and a mutually independent adjustment of these two stages to a different amplitude-frequency response of the signal at those frequencies in the transmission frequency range which can be influenced by these stages, a very effective and flexible adjustment of the overall amplitude-frequency response, particularly for an aurally compensated volume control, is obtained with a small number of circuit elements. It is, in particular, simple to obtain a satisfactorily steep transition of the amplitude-frequency response from a boost of low-frequency signal components to a signal attenuation at the mid-range frequencies. Such a steep transition cannot be obtained by means of bass and treble controls constructed in the manner described in the afore-mentioned literature. An additional advantage of the circuit arrangement in accordance with the invention is that it has a particularly low noise. Thus, the circuit arrangement in accordance with the invention is very flexible in use in combination with a reduced circuit complexity and an improved transmission characteristic.

In an embodiment of the circuit arrangement in accordance with the invention, the bass control stage comprises an amplifier with controllable negative feedback and having an output connected to a first voltage divider arrangement with a frequency-dependent characteristic, which voltage divider arrangement has a plurality of taps which can be connected to an inverting input of the amplifier via a first electronically controllable switch, a non-inverting input of the amplifier being connected to the signal input of the circuit arrangement and the signal with an amplitude-frequency response boosted at the low frequencies being available at the output of the amplifier. Such a circuit arrangement combines the advantage of a low complexity with simple digital controllability.

In a variant of the circuit arrangement in accordance with the invention, the first voltage divider arrangement comprises a first resistor chain formed by a series arrangement of resistors, whose nodes and ends form the taps, a first end of the first resistor chain being connected to the output of the amplifier, and a first network with a frequency-dependent characteristic, having a first terminal connected to a second end of the first resistor chain, having a second terminal connected to the output of the amplifier and having a third terminal connected to ground.

In this arrangement, the basic amplitude-frequency response is determined by the first network and can simply be adapted to different requirements by changes in this network. Since the negative feedback of the amplifier can be varied via the taps of the first voltage divider arrangement, i.e., the first resistor chain, this basic amplitude-frequency response can be amplified or attenuated. For the dimensioning of the bass control stage, the advantage is obtained that the first network and the first resistor chain can be dimensioned independently of one another. Preferably, the first resistor chain forms an integrated device with the first switch and the amplifier, to which an external network, which is easy to adapt to specific requirements, can be added.

In a suitable embodiment of the circuit arrangement in accordance with the invention, the notch filter stage comprises a second voltage divider arrangement with a frequency-dependent characteristic, which voltage divider arrangement has a plurality of taps which can be connected to the signal output of the circuit arrangement via a second electronically controllable switch, one end of the second voltage divider arrangement being arranged to receive the signal from the bass control stage. Specifically, the second voltage divider arrangement comprises a second resistor chain formed by a series arrangement of resistors, whose nodes and ends form the taps, a first end of the second resistor chain being connected to that end of the second voltage divider arrangement which is arranged to receive the signal from the bass control stage, and a second network with a frequency-dependent characteristic, having a first terminal connected to the first end of the second resistor chain, having a second terminal connected to the second end of the second resistor chain, and having a third terminal connected to ground.

Since the switches are controlled independently of one another, preferably by a suitable control circuit by means of digital control signals, an amplitude-frequency response can be obtained which is variable within very wide limits and which can meet practically all the requirements of different signal sources. When the arrangement is used for aurally compensated volume control, it is possible to obtain an amplitude-frequency response which corresponds exactly to the desired auditory sensation for any volume setting, for any signal source and for any available device for signal processing and conversion into sound waves.

Preferably, in addition to the stages described, there is provided a third switch having an output, which is connected to the signal output of the circuit arrangement, and having two inputs, which can be connected selectively to the output, a first one of said inputs being arranged to receive the signal from the signal input of the circuit arrangement and a second one of said inputs being arranged to receive the signal from the notch filter stage. By means of this switch the circuit arrangement in accordance with the invention can be switched into or out of a signal path depending on the desired signal transmission characteristic, a frequency-independent transmission being obtained when switched out.

BRIEF DESCRIPTION OF THE DRAWINGS

Some exemplary embodiments of the invention are shown in the drawings, corresponding elements in different Figures of the drawings bearing the same reference symbols. In the drawings.

DESCRIPTION OF THE PREFERRED EMBODIMENTS

Figures 1, 2:
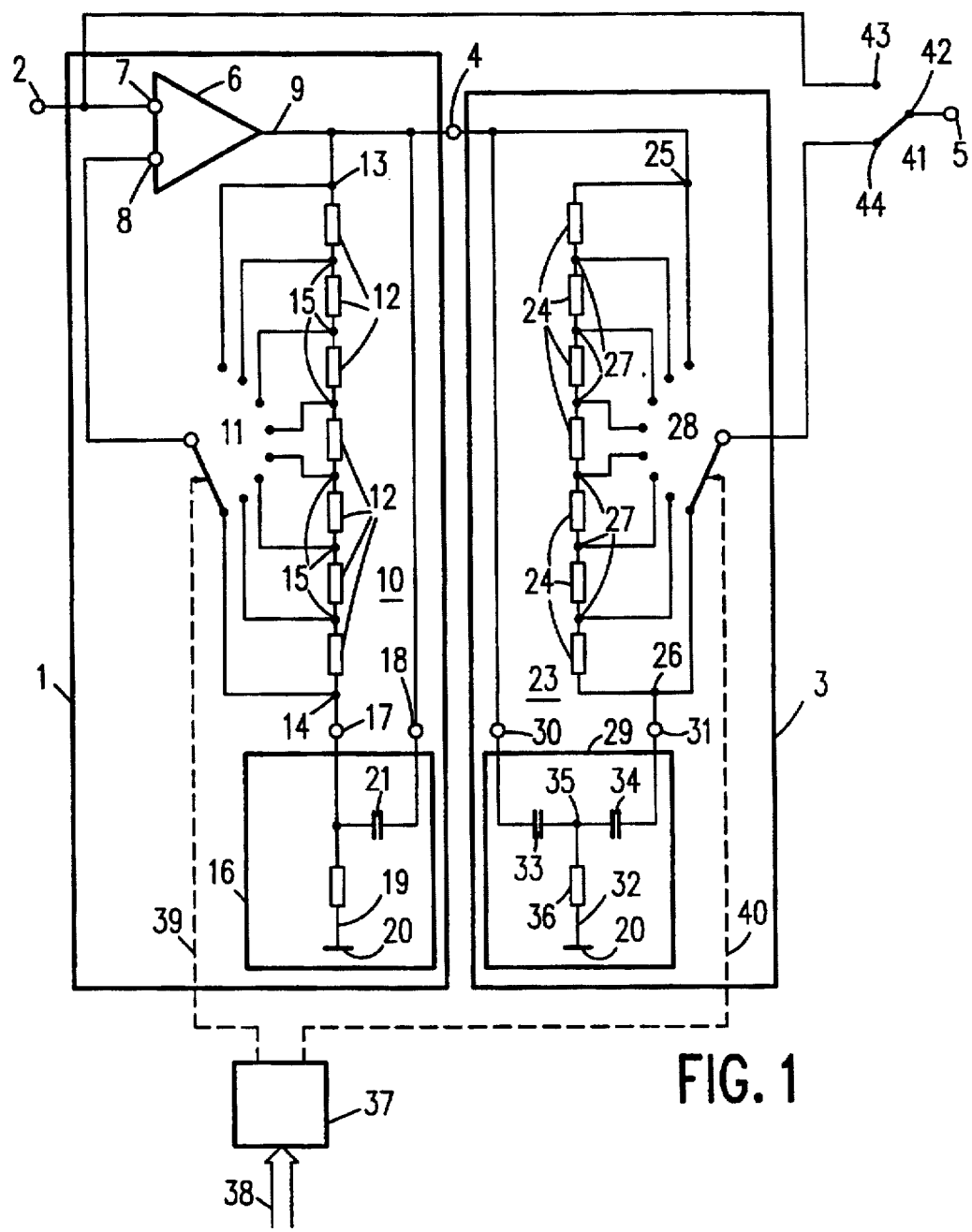
FIG. 1 shows a first exemplary embodiment of the circuit arrangement in accordance with the invention.
FIG. 2 shows a second exemplary embodiment of the circuit arrangement in accordance with the invention, which is a modification of that shown in FIG. 1.

In FIG. 1, a bass control stage referenced 1 is connected to a signal input 2, via which it is possible to apply a signal having a given transmission frequency band and whose amplitude-frequency response is to be controlled within this band. By way of example, it is assumed that the signal is an audio signal whose transmission frequency band extends between 20 Hz and 20 kHz. The circuit arrangement shown in FIG. 1 is then preferably used for aurally compensated volume control. However, it is obvious that signals having other frequency bands and other uses are possible.

The circuit arrangement in FIG. 1 further comprises a notch filter stage 3 having an input terminal connected to an output terminal of the bass control stage 1. In FIG. 1 these two interconnected terminals are shown as a node 4. The processed signal is applied from the notch filter stage 3 to a signal output 5.

The bass control stage 1 comprises an amplifier 6, which is constructed as a differential amplifier, having a non-inverting input 7, which is connected to the signal input 2, and having an inverting input 8 and an output 9. Controllable negative feedback between the output 9 and the inverting input 8 is provided by a first voltage divider arrangement 10 with a frequency-dependent characteristic and a first electronically controllable switch 11. The first voltage divider arrangement 10 comprises a fast resistor chain 12 of series-connected resistors. This first resistor chain 12 has its first end 13 connected to the node 4 and hence to the output 9 of the amplifier 6. A second end 14 of the first resistor chain 12 and nodes 15 between the resistors of the first resistor chain 12 form a series of taps of the first voltage divider arrangement 10, which can be connected selectively to the inverting input 8 of the amplifier 6 via the first switch 11. In the example shown in FIG. 1, the fast resistor chain 12 comprises seven resistors and hence two end points and six nodes, yielding a total of eight taps for the fast voltage divider arrangement. Accordingly, the fast switch 11 has eight switch positions.

For simplicity, FIG. 1 shows the first switch 11 as a mechanical switch having one wiper and eight switch contacts. However, in practice, such a switch is formed by electronic switching means. Obviously, the number of taps may then be larger or smaller than the eight in the example in FIG. 1, in which case the first resistor chain 12 comprises a correspondingly larger or smaller number of resistors. Such a voltage divider arrangement can then be integrated very advantageously on a semiconductor body and is preferably controlled by digital signals. However, in principle, the fast switch 11 and the fast resistor chain 12 can also be constructed as an analog potentiometer circuit, which will not affect the manner in which the signals applied to the signal input 2 are processed.

The first voltage divider arrangement 10 further comprises a fast network 16 with a frequency-dependent characteristic, having a first terminal 17 connected to the second end point 14 of the fast resistor chain 12, having a second terminal 18 connected to the output 9 of the amplifier 6 and hence to the node 4, and having a third terminal 19 connected to ground 20. In the embodiment shown in FIG. 1, this first network 16 comprises, between the first terminal 17 and the second terminal 18, a fast capacitor 21, which is connected across the ends 13, 14 of the fast resistor chain 12, and between the first terminal 17 and the third terminal 19 of the first network 16 a fast resistor 22, which connects the second end 14 of the fast resistor chain 12 to ground 20. The first network 16 gives the first voltage divider arrangement 10 such a frequency-dependent characteristic that the signal applied to the signal input 2 appears at the output 9 of the amplifier 6 and hence at the node 4 with an amplitude-frequency response which is raised at the low frequencies.

The notch filter stage 3 of the circuit arrangement shown in FIG. 1 comprises a second voltage divider arrangement 23 having a frequency-dependent characteristic and comprising a second resistor chain 24 of resistors arranged in series. The second resistor chain 24 has a first end connected to the node 4 and hence to the output terminal of the second voltage divider arrangement 23, which is arranged to receive the signal from the bass control stage 1. A second end 26 of the second resistor chain 24 and nodes 27 between the individual resistors of the second resistor chain 24 together with the fast end 25 form taps of the second voltage divider arrangement 23, which taps are connected to switch contacts of a second electronically controllable switch 28, whose wiper is coupled to the signal output 5. The second resistor chain 24 and the second electronically controllable switch 28 are constructed and shown in FIG. 1 in the same way as the first switch 11 and the first resistor chain 12.

The second voltage divider arrangement 23 further comprises a second network 29 having a frequency-dependent characteristic and having a first terminal 30 connected to the first end 25 of the second resistor chain 24, a second terminal 31 to the second end 26 of the second resistor chain 24, and a third terminal 32 to ground 20. Thus,the first terminal 30 is also connected to the node 4. Between its fast terminal 30 and its second terminal 31, the second network 29 comprises a series arrangement of a fourth capacitor 33 and a fifth capacitor 34, which series arrangement thus shunts or is shunted by the second resistor chain 24. A node 35 between the fourth capacitor 33 and the fifth capacitor 34 is also connected to the grounded third terminal of the second network 29 via a third resistor 36 which also forms part of the second network 29.

The second network 29 determines the frequency-dependent characteristic of the second voltage divider arrangement 23 and, as a consequence, of the notch filter stage 3. It forms a T filter bridged by the second resistor chain 24. The notch filter stage lowers the amplitude-frequency response of the signal applied to the node 4 at the mid frequencies of the transmission frequency band. The part of the frequency band in which this attenuation occurs is dictated by the dimensioning of the elements of the second network 29 as well as the second resistor chain 24. The degree of lowering, i.e., the degree of signal attenuation, is adjustable via the second switch 29 independently of the bass control stage 1.

Figure 3:
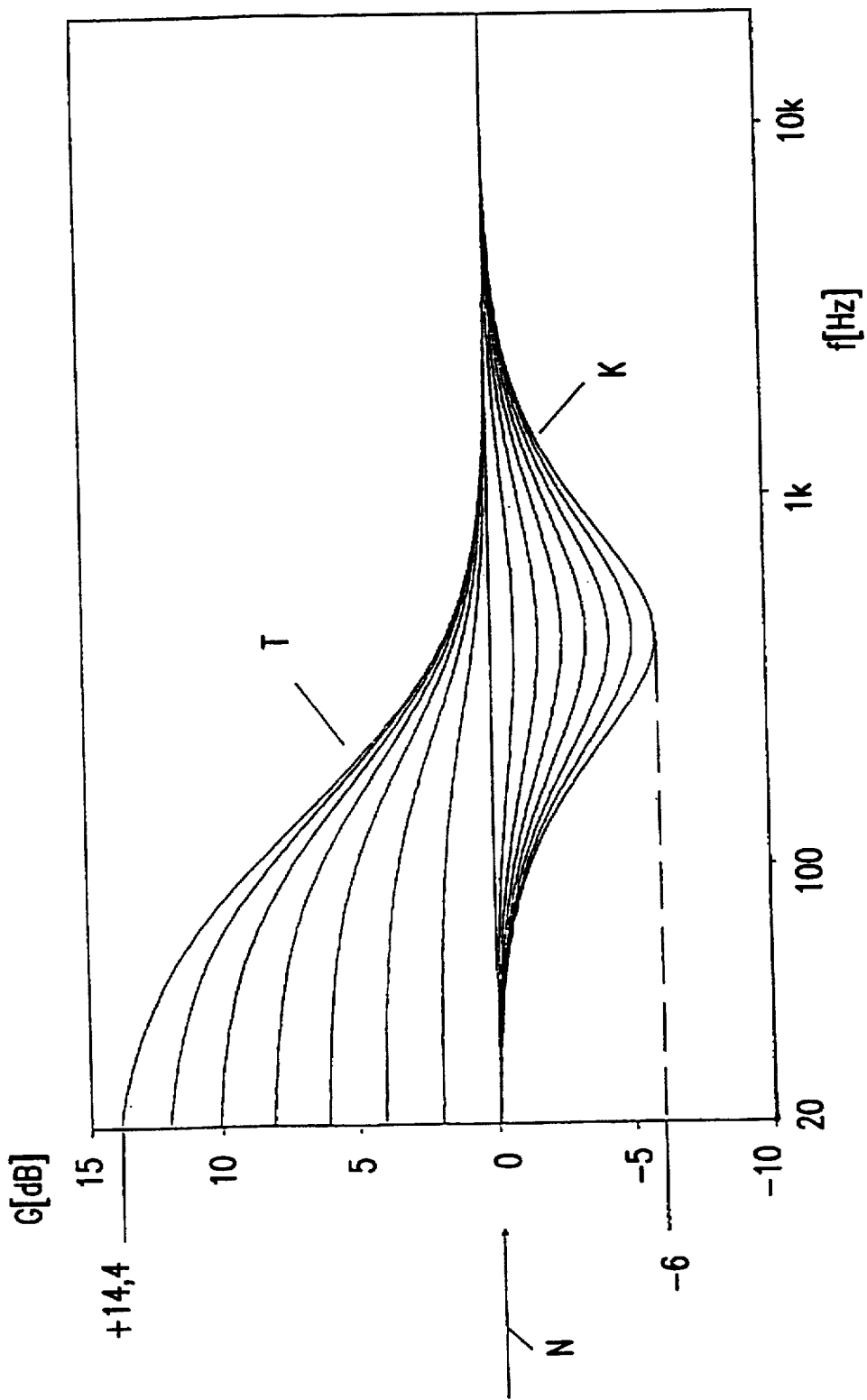
FIG. 3 is a diagram illustrating the amplitude-frequency response of the circuit arrangement shown in FIG. 1.

For a dimensioning example of the circuit arrangement shown in FIG. 1, FIG. 3 shows the amplitude-frequency response of the bass control stage 1 for the individual switch positions of the switch 11 and the amplitude-frequency response of the notch filter stage 3 for the individual switch positions of the second switch 28. The frequency f of the signal is plotted horizontally and the gain G for the signal to be processed between the signal input 2 and the node 4 for the bass control stage 1 and between the node 4 and the signal output 5 for the notch filter stage 3 is plotted vertically. The family of curves T for the amplitude-frequency response of the bass control stage 1 for the individual switch positions of the first switch 11 is shown above the horizontal 0 dB line for unity gain, the horizontal line for 0 dB corresponding to the switch position in which the first end 13 of the first resistor chain 12 is connected to the inverting input 8 of the amplifier 6. The curves of the family T above the 0 dB line apply to the subsequent change-over to the individual nodes 15, the upper line of the family of curves T corresponding to the amplitude-frequency response of the bass control stage 1 when the second end 14 of the first resistor chain 12 is connected to the inverting input 8 of the amplifier 6 via the first switch 11. In the present dimensioning example, this remits in a gain of 14.4 dB at the lower limit of the transmission frequency band, i.e., 20 Hz in the present case. At the mid-range frequencies, the curves of the family lie closer to one another and for the high frequencies of the transmission frequency band they merge into one another and into the 0 dB line.

In FIG. 3, a family of curves K represents the amplitude-frequency response of the notch filter stage 3 alone for the various positions of the second switch 28. The horizontal line for a gain G of 0 dB corresponds to that position of the wiper of the second switch 28 in which the first end 25 of the second resistor chain 24 is coupled directly, i.e., without the inclusion of any of the resistors of the second resistor chain 24, to the signal output 5. The lower curves, i.e., those for larger reductions of the gain G, represent the amplitude-frequency response for the individual positions of the wiper of the second switch 28, the curve of the family K with the largest reduction of the gain G, which reduction corresponds to 6 dB in the dimensioning example of FIG. 3, representing the amplitude-frequency response of the notch filter stage 3 in the switch position of the second switch 28 in which the second end 26 of the second resistor chain 24 is coupled to the signal output 5. Thus, the degree of reduction of the gain G at the mid-range frequencies, i.e., approximately in the range between 200 Hz and 1 kHz in the dimensioning example of FIG. 3, can be selected by means of the second switch 28.

The horizontal line at a gain G of 0 dB, corresponding to the amplitude-frequency response of the bass control stage 1 in the position of the fast switch 11 in which the first end 13 of the fast resistor chain 12 is connected to the inverting input 8 of the amplifier 6 and further corresponding to the amplitude-frequency response of the notch filter stage 3 in the position of the second switch 28 in which the fast end 25 of the second resistor chain 24 is coupled directly to the signal output 5, thus represents the amplitude-frequency response of the entire circuit arrangement of FIG. 1 between the signal input 2 and the signal output 5 when both the bass control stage 1 and the notch filter stage 3 are disabled.

The individual curves of the families of curves T and K for the various settings of the bass control stage and the notch filter stage can be combined in many ways in accordance with the different combinations of switch positions which can be selected for the switches 11 and 28. It is then possible, for example, to combine curves for a small rise in the amplitude-frequency response at low frequencies with curves for a small reduction in the amplitude-frequency response at mid-range frequencies and, likewise, curves for a large rise with curves for a large reduction. The switches 11 and 28 are then switched in the same direction. However, the invention also offers the possibility to adapt the rise in the amplitude-frequency response at low frequencies independently of the reduction at mid-range frequencies to the relevant requirements imposed on the characteristics of the sources of the signal to be processed and of the receiving devices to which it is to be transferred. For example, in the case of audio signals, loudspeakers or similar sound reproduction systems in buildings may exhibit other transmission characteristics and may, consequently, impose other requirements on the amplitude-frequency response than comparable devices in motor vehicles. Likewise, audio signals from recording equipment may impose other requirements that audio signals from radio receiver equipment or the like. This simply enables an optimum amplitude-frequency response to be selected for any case and, consequently, for any combination of source and receiving device.

Such a use of the circuit arrangement in accordance with the invention is preferably combined with a device for controlling the gain G, which, in the simplest case, raises or reduces the gain of the signal independently of the frequency, i.e., over the entire transmission frequency band. The output of such a device may be connected, for example, to the signal input 2 of the circuit arrangement of FIG. 1 and is not shown in FIG. 1. If it is used in conjunction with the circuit arrangement of FIG. 1, the 0 dB line N in FIG. 3 will correspond to the gain or signal level at the signal input 2. This gain or signal level whose amplitude-frequency response in the ideal case is frequency independent throughout the transmission frequency band, though this is not necessary, is then combined with the amplitude-frequency response of the circuit arrangement shown in FIG. 1. In the case of undesired irregularities in the amplitude-frequency response at the signal input 2, these can also be corrected to some extent by means of the circuit arrangement in accordance with the invention.

Figure 4:
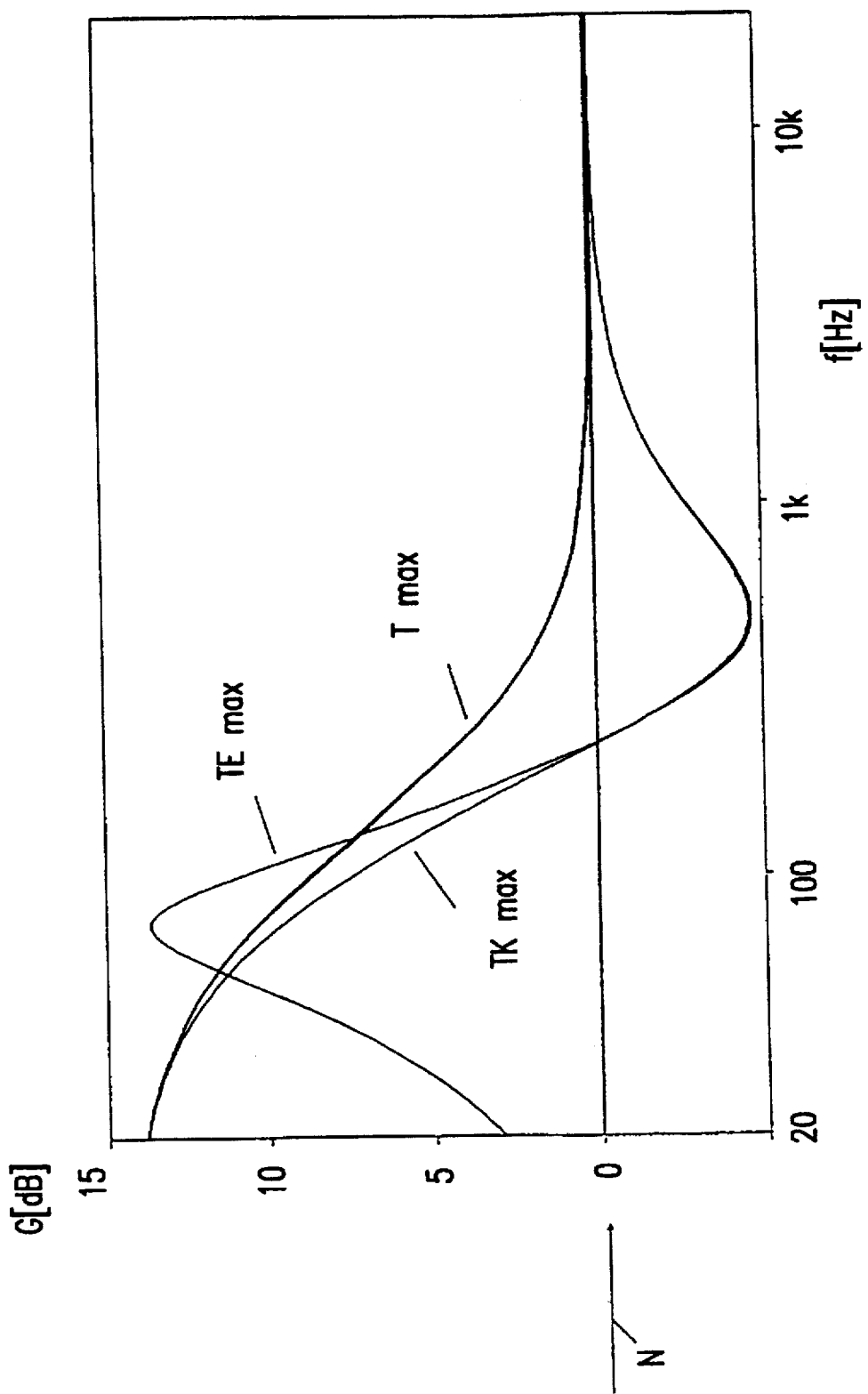
FIG. 4 is another diagram illustrating the amplitude-frequency response of the circuit arrangement shown in FIGS. 1 and 2.

To illustrate the various amplitude-frequency response curves which can be obtained the diagram in FIG. 4 shows a curve Tmax and a further curve TKmax in addition to the line N already known from FIG. 3. The curve Tmax corresponds to the amplitude-frequency response of the bass control stage in the case of a maximum rise for low frequencies in accordance with the uppermost curve of the family of curves T while the notch filter stage 3 is disabled. The curve TKmax is a combination of the curve Tmax with that curve of the family K which represents the maximum attenuation by the notch falter stage 3 for the mid frequencies. These curves Tmax and TKmax in FIG. 4 clearly show the steeper slope at the transition between the low and the mid-range frequencies, which is caused by the notch filter stage 3. It is this steep transition which is, for example, important for audio signal processing in car radios.

In the circuit arrangement of FIG. 1, the switches 11 and 28 are controlled by means of a control circuit 37, which is preferably adapted top receive control data via a data line 38, from which it derives control signals by means of which the switches 11 and 28 can be actuated via control lines 39 and 40, respectively. When the circuit arrangement in accordance with the invention is used in conjunction with other signal processing stages the control circuit 37 and the data line 38 may also be combined with the control devices of these processing stages.

The circuit arrangement shown in FIG. 1 further comprises a third switch 41 having an output 42 connected to the signal output 5 and having two inputs 43 and 44, of which a first input 43 is connected to the signal input 2 and of which a second input 44 is connected to the wiper of the second switch 28. Thus, the signal from the signal input 2 can be applied to the signal output 5 either directly or after processing by the bass control stage 1 and the notch filter stage 3. The third switch 41 may also be adapted to be controllable by the control circuit 37, which for the sake of clarity, is not shown in FIG. 1. The third switch 41 bypasses both the amplifier 6 and the second switch 28 in order to disable the bass control stage 1 and the notch filter stage 3, which particularly enables the noise characteristics of the circuit arrangement in the case of a linear frequency response to be improved.

In a circuit arrangement shown in FIG. 2, which is a modification of that shown in FIG. 1, the first network, which now bears the reference numeral 160, comprises between its first terminal 17 and its second terminal 18 a series arrangement of a second capacitor 161 and a third capacitor 162, which shunts the ends 13 and 14 of the First resistor chain 12 via the terminals 17 and 18, respectively, the circuit arrangement being unmodified for the remainder.

The first network 160 shown in FIG. 2 further comprises a second resistor 163, which connects a node 164 between the second capacitor 161 and the third capacitor 162 to the third terminal 19 of the first network 160 in FIG.2, which third terminal is connected to ground 20. Thus, the first network 160 in FIG. 2 is of a construction similar to that of the second network 29 of the notch filter stage 3 and constitutes a T filter bridged by the first resistor chain 12. As a result of this, the bass control stage 1 thus modified is given an amplitude-frequency response which starting from the mid frequencies of the transmission frequency band initially rises towards lower frequencies but at the low-frequency end of the transmission frequency band again exhibits a roll-off. An example of such an amplitude-frequency response is represented by the curve TEmax in FIG. 4, which shows the amplitude-frequency response of a circuit arrangement as shown in FIG. 1 modified in accordance with FIG. 2 with a maximum rise of the amplitude-frequency response at low frequencies and a maximum attenuation by the notch filter stage 3 at mid-range frequencies. In analogy with the family of curves T in FIG. 3, changing over the fast switch 11 also results in a family of curves with a reduced rise of the frequency-dependent characteristic below the curve TEmax for the bass control stage 1 thus modified, and the individual curves of this family of curves may also be combined arbitrarily with individual curves of the family of curves K of the notch filter stage 3.

Figure 5:
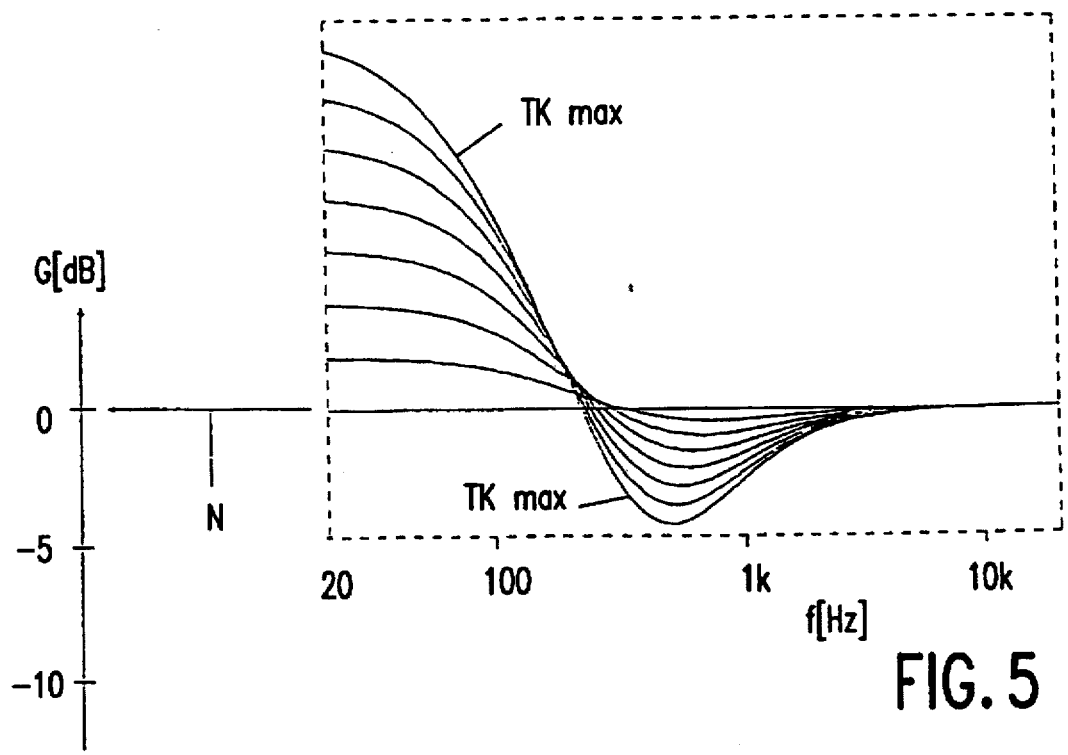
FIGS. 5, 6 and 7 are diagrams illustrating the amplitude-frequency response of the circuit arrangement shown in FIG. 1 for different exemplary situations.
Figure 6:
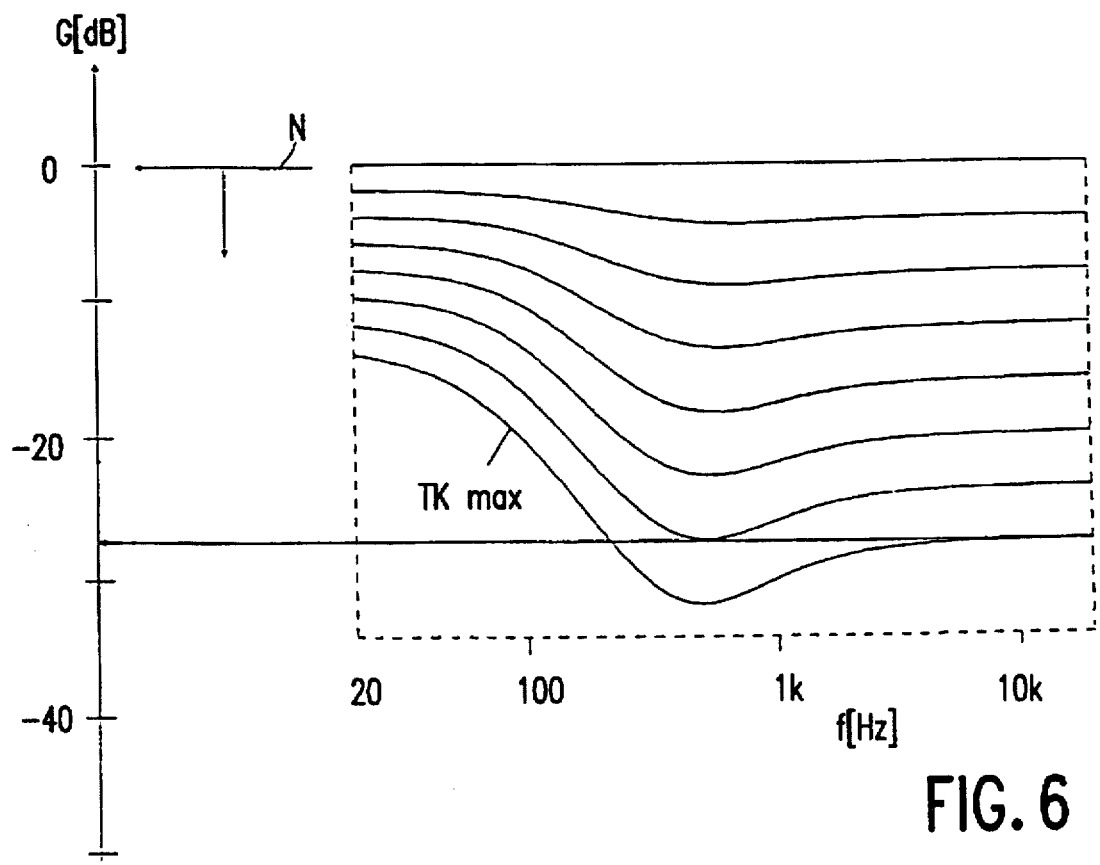
Figure 7:
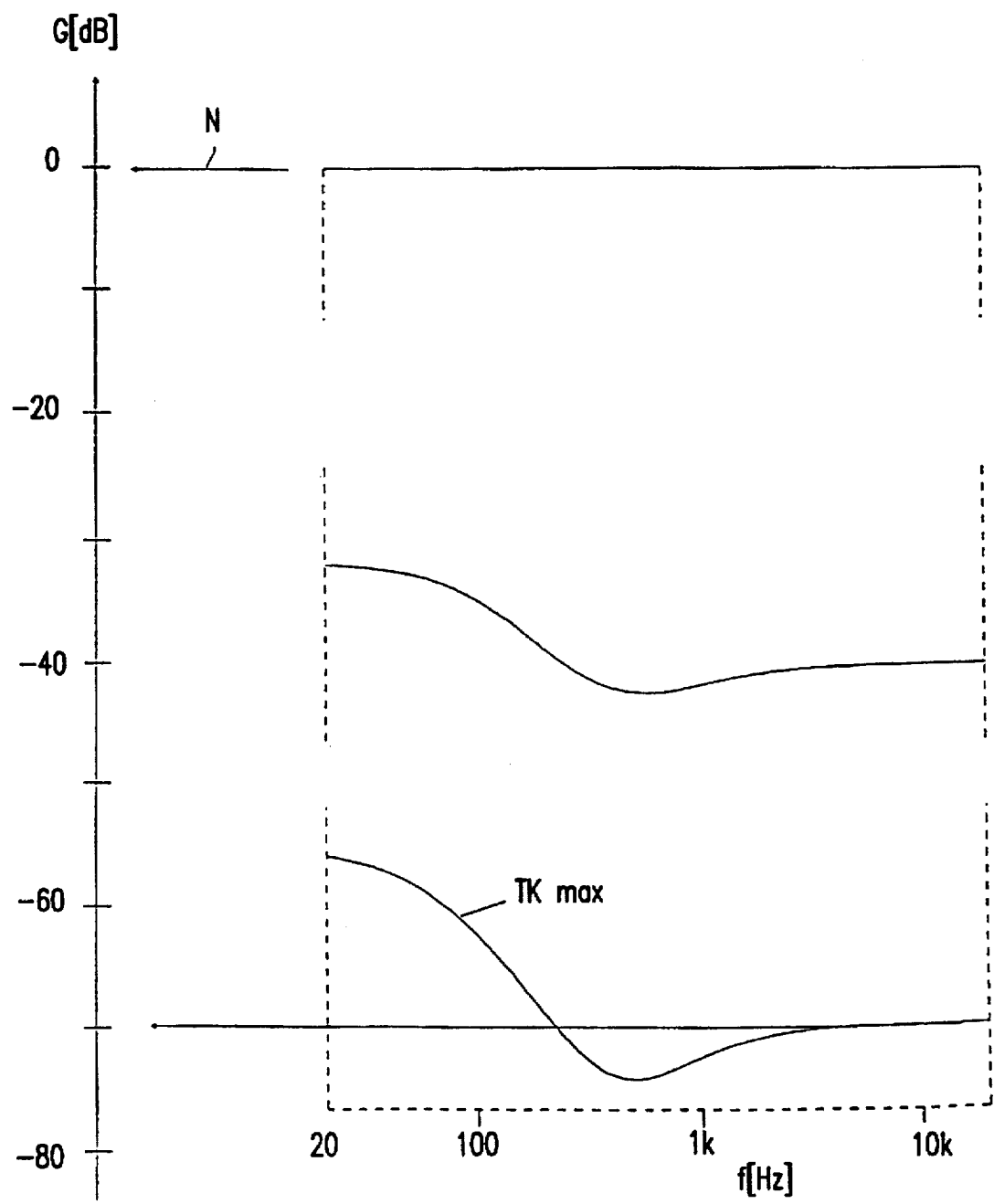

The circuit arrangement in FIG. 1 modified as shown in FIG. 2 can be used very advantageously for the aurally compensated volume control in car radios to eliminate distortion and booming of audio signals or sound waves of very low frequency. Another use is the reproduction of audio signals from digital record carriers, particularly optical records ("Compact Disc"), which even for frequencies at the low-frequency end of the transmission frequency band, for example, below, 40 Hz, still contain audio signals. In the case of a bass control stage 1 constructed as shown in FIG. 1 and in accordance with the family of curves T in FIG. 3 these signals reach the signal processing stages and reproducing devices, for example bass output stages and associated loudspeakers which follow the signal output 5 of the circuit arrangement in accordance with the invention, and in the case of a corresponding rise of the amplitude-frequency response they produce an excess drive and, as a consequence, a high power dissipation in the above-mentioned devices. This power dissipation results in waste heat being produced and, in the extreme case, said stages being destroyed. With an amplitude-frequency response in accordance with the curve TEmax as shown in FIG. 4, i.e., a steep bass roll-off at the low-frequency end of the transmission frequency band this problem can be solved effectively. Moreover, the circuit arrangement of FIG. 1 modified in accordance with FIG. 2 enables the maximum bass boost to be transferred to a frequency band in which particularly an expensive loudspeaker is still capable of converting the electric power of the audio signals applied to it into sound waves. This leads to a cost reduction for the entire audio-signal reproducing arrangement as well as an improved efficiency. FIGS. 5 to 7 family show three examples in which the bass control stage 1 and the notch filter stage 3 in the embodiment shown in FIG. 1 for aurally compensated volume control are controlled depending on the setting of the overall gain of an audio reproducing arrangement. For the sake of simplicity, it is assumed for the various diagrams that the switches 11 and 28 are always in such a way that their wipers are moved in the same direction, so that in the case of a small rise of the amplitude-frequency response at low frequencies the roll-off of the amplitude-frequency response at the mid frequencies is also small, whereas a large rise of the amplitude-frequency response at low frequencies is associated with a large roll-off at the mid frequencies. In principle, this corresponds to the standard situation of aurally compensated volume control, where small boosts or attenuations are associated with a high overall gain G of the audio signals, whereas the strong boost of the low frequencies and the strong attenuation of the mid frequencies in the amplitude-frequency response take effect at a low gain G or a strong attenuation of the audio signals in order to ensure that in the case of quiet sound reproduction the low-frequency signals remain audible and to reduce the dominant effect at the mid frequencies. As is apparent from FIGS. 3 and 4, it is to be noted that, in principle, the gain G of the bass control stage 1 and the notch filter stage 3 at high frequencies of the transmission frequency band is then not changed.

FIG. 5 shows a family of curves thus obtained if the switches 11 and 28 of the bass control stage 1 and the notch falter stage 3, respectively, are actuated in the same sense while a signal is applied to the signal input 2 with unchanged level, i.e., with unchanged gain G and with a level which is constant for all frequencies of the transmission frequency band. The family of curves shown in FIG. 5 comprises eight curves in accordance with the number of switch contacts of the switches 11 and 28 and the number of taps of the first resistor chain 12 and the second resistor chain 24, including a horizontal curve representing a constant amplitude-frequency response corresponding to the situation in which both the bass control stage 1 and the notch filter stage 3 are disabled. For high frequencies in the transmission frequency band the gain G is identical for all the curves of the family of curves in FIG. 5. FIG. 5 thus represents different steps of an aurally compensated volume control without any change of an externally selected volume setting.

FIG. 6 shows a family of curves whose individual curves are generated in the same way as those in FIG. 5. However, in addition, each curve is combined with a signal attenuation which increases at low and mid-range frequencies as the amplitude-frequency response rises or rolls off increasingly, which means a decreasing volume and hence a decreasing overall gain G. This situation corresponds to the known principle of aurally compensated volume control, where the boost or attenuation in the described frequency bands increases as the volume decreases. FIG. 7 shows a variant of the family of curves shown in FIG. 6, where in comparison with the situation in FIG. 6 a substantially higher signal attenuation is applied, i.e., a substantially larger reduction of the gain G, by means of a volume control coupled to the circuit arrangement shown in FIG. 1. For clarity FIG. 7 shows only the line N for a gain G of 0 dB and the curve TKmax for a maximum boost at low frequencies and a maximum attenuation at mid frequencies, which are also given in the diagrams in FIGS. 4, 5 and 6, and a curve for an intermediate value of the settings.

The vertical scale for the gain G in FIGS. 5 to 7 is proportioned in such a manner that when the bass control stage 1 and the notch falter stage 3 are disabled and the gain is maximum, an associated volume control device always ensures that a value of 0 dB is obtained. It is obvious that variants of the characteristics shown in FIGS. 5 to 7 are possible. These variants relate, on the one hand, to a changed combination of the settings of the switches 11 and 28, thus enabling the shapes of the families of curves to be varied, and, on the other hand, to other changed relationships between the external volume settings and the settings of the amplitude-frequency response by means of the bass control stage 1 and the notch falter stage 3. It is obvious that instead of the bass control stage 1 of FIG. 1, the modification of FIG. 2 may be used. In order to preclude, for example, overdriving of a subsequent signal processing arrangements in the case of a configuration in accordance with FIG. 5, this configuration may be changed, for example, in such a manner that only those curves with a larger rise of the amplitude-frequency response at low frequencies are ultimately lowered through an associated gain reduction by means the external volume control device in order not to exceed a maximum permissible gain G.

The circuit arrangement in accordance with the invention is preferably integrated on a semiconductor body. It is then advantageous if the first terminal 17 of the first network 16, a connection between the node 4, the second terminal 18 of the first network 16 and the first terminal 30 of the second network 29, and the second terminal 31 of the second network 29 form external connections of this integrated circuit. The networks 16, 29 and 160 are then constructed as external devices. This enables the amplitude-frequency response curves to be adapted very simply to specific requirements by differently dimensioning the networks 16, 29 and 160.

The circuit arrangement in accordance with the invention can also be adapted simply to related fields of use. For example, the second switch 28 can be set to a switch position in which the first end 25 of the second resistor chain 24 is connected directly to the signal output 5. The notch filter stage 3 is then inoperative. If desired, the signal which has been processed by the bass control stage 1 only may also be taken directly from the node 4 if this node is an external connection as described above. The circuit arrangement is then merely used as a bass control device.

With another dimensioning the notch filter stage 3 may also be constructed in such a manner that, in the same way as described for the first network 160 in FIG. 2, it provides not only an aurally compensated adaptation of the gain but also suppresses parasitic resonances, for example, in the interior of a vehicle in the case of a car radio.

Particularly when used for aurally compensated volume control the circuit arrangement in accordance with the invention has the advantage that it provides a separation between the volume control which is uniform for all the frequencies of the transmission frequency band and the compensating boost or attenuation in individual portions of the transmission frequency band. This enables an arbitrary combination of the two functions to be obtained with simple means. In particular, this makes it possible to allow for different sources of signals with different signal levels as well as different amplitude-frequency response characteristics by a suitable setting in the control circuit 37 in combination with the volume setting. The required volume control is then possible independently of the level of the relevant source and also independently of the characteristics of the devices to which the signals are to be applied. This can also be effected automatically when the relevant source is selected. When switching between different sources this makes it possible to achieve the same volume sensation throughout the transmission frequency band, so that the audio signals from all the sources always give the same sound impression. The control range for the volume can then be selected freely without any limitations depending on the type of apparatus to be equipped with the arrangement. Moreover, it is advantageous for the dimensioning that the aurally compensated volume control does not give rise to a change of the perceived overall volume, i.e., of the overall gain of the signal.

We claim:

1. A circuit arrangement with controllable transmission characteristics between a signal input and a signal output for a signal within a given transmission frequency band, said circuit arrangement comprising a bass control stage to which the signal, applied to the signal input, is applied for adjustably boosting an amplitude-frequency response of the signal at low frequencies of the given transmission frequency band, and a notch filter stage to which the signal processed in the bass control stage is applied for attenuating the amplitude-frequency response of the signal at mid-frequencies of the given transmission frequency band independently of the bass control stage, said notch filter stage applying the signal thus processed to the signal output, characterized in that the bass control stage comprises an amplifier with controllable negative feedback and having an output connected to a first voltage divider arrangement with a frequency-dependent characteristic, said voltage divider arrangement having a plurality of taps which are connectable to an inverting input of the amplifier via a first electronically controllable switch, a non-inverting input of the amplifier being connected to the signal input of the circuit arrangement, and a signal with an amplitude-frequency response boosted at the low frequencies being available at the output of the amplifier.

2. A circuit arrangement as claim in claim 1, characterized in that the first voltage divider arrangement comprises:
   a first resistor chain formed by a series arrangement of resistors, said first resistor chain having nodes between the resistors and first and second ends forming the taps of said first voltage divider, the first end of the first resistor chain being connected to the output of the amplifier; and
   a first network with a frequency-dependent characteristic, having a first terminal connected to the second end of the first resistor chain, a second terminal connected to the output of the amplifier, and a third terminal connected to ground.

3. A circuit arrangement as claimed in claim 2, characterized in that the first network comprises a first capacitor between the first terminal and the second terminal, and a first resistor between the first terminal and the third terminal.

4. A circuit arrangement as claimed in claim 2, characterized in that the first network comprises a first capacitor and a second capacitor arranged in series between the first terminal and the second terminal, and a second resistor connecting a node between the second capacitor and the third capacitor to the third terminal.

5. A circuit arrangement as claimed in claim 1, characterized in that the circuit arrangement further comprises a control circuit for controlling the first electronically controllable switch so as to obtain a desired amplitude-frequency response in the transmission frequency band.

6. A circuit arrangement with controllable transmission characteristics between a signal input and a signal output for a signal within a given transmission frequency band, said circuit arrangement comprising a bass control stage to which the signal, applied to the signal input, is applied for adjustably boosting an amplitude-frequency response of the signal at low frequencies of the given transmission frequency band, and a notch filter stage to which the signal processed in the bass control stage is applied for attenuating the amplitude-frequency response of the signal at mid-frequencies of the given transmission frequency band independently of the bass control stage, said notch filter stage applying the signal thus processed to the signal output, characterized in that the notch filter stage comprises a first voltage divider arrangement with a frequency-dependent characteristic, said first voltage divider arrangement having a plurality of taps which are connectable to the signal output of the circuit arrangement via a first electronically controllable switch, one end of the first voltage divider arrangement being arranged to receive the signal from the bass control stage.

7. A circuit arrangement as claimed in claim 6, characterized in that the first voltage divider arrangement comprises:
   a first resistor chain formed by a series arrangement of resistors, said first resistor chain having nodes between the resistors and first and second ends forming the taps of the first voltage divider arrangement, the first end of the first resistor chain being connected to the end of the first voltage divider arrangement receiving the signal from the bass control stage; and
   a first network with a frequency-dependent characteristic, having a first terminal connected to the first end of the first resistor chain, a second terminal connected to the second end of the first resistor chain, and a third terminal connected to ground.

8. A circuit arrangement as claimed in claim 7, characterized in that the first network comprises a first capacitor and a second capacitor arranged in series between the first terminal and the second terminal, and a first resistor connecting a node between the first capacitor and the second capacitor to the third terminal.

9. A circuit arrangement as claimed in 6, characterized in that the circuit arrangement further comprises a control circuit for controlling the first electronically controllable switch so as to obtain a desired amplitude-frequency response in the transmission frequency band.

10. A circuit arrangement with controllable transmission characteristics between a signal input and a signal output for a signal within a given transmission frequency band, said circuit arrangement comprising a bass control stage to which the signal, applied to the signal input, is applied for adjustably boosting an amplitude-frequency response of the signal at low frequencies of the given transmission frequency band, and a notch filter stage to which the signal processed in the bass control stage is applied for attenuating the amplitude-frequency response of the signal at mid-frequencies of the given transmission frequency band independently of the bass control stage, said notch filter stage applying the signal thus processed to the signal output, characterized in that said circuit arrangement further comprises a switch having an output connected to the signal output of the circuit arrangement, and having two inputs connected selectively to the output, a first one of said two inputs receiving the signal applied to the signal input of the circuit arrangement, and a second one of said two inputs receiving the signal from the notch filter stage.

11. A circuit arrangement with controllable transmission characteristics between a signal input and a signal output for a signal within a given transmission frequency band, comprising a bass control stage to which the signal, applied to the signal input, is applied, for adjustably boosting an amplitude-frequency response of the signal at low frequencies of the given transmission frequency band, characterized in that said circuit arrangement further comprises a notch filter stage to which the signal processed in the bass control stage is applied for attenuating the amplitude-frequency response of the signal at mid-frequencies of the given transmission frequency band independently of the bass control stage, said notch filter stage applying the signal thus processed to the signal output, wherein the bass control stage comprises an amplifier with controllable negative feedback and having an output connected to a first voltage divider arrangement with a frequency-dependent characteristic, said voltage divider arrangement having a plurality of taps which are connectable to an inverting input of the amplifier via a first electronically controllable switch, a non-inverting input of the amplifier being connected to the signal input of the circuit arrangement, and a signal with an amplitude-frequency response boosted at the low frequencies being available at the output of the amplifier, wherein the notch filter stage comprises a second voltage divider arrangement with a frequency-dependent characteristic, said second voltage divider arrangement having a plurality of taps which are connectable to the signal output of the circuit arrangement via a second electronically controllable switch, one end of the second voltage divider arrangement being arranged to receive the signal from the bass control stage, and wherein the circuit arrangement further comprises a control circuit for controlling the first and second electronically controllable switches independently of one another so as to obtain a desired amplitude-frequency response in the transmission frequency band.

* * * * *